United States Patent [19]
Vietze et al.

[11] Patent Number: 5,481,211
[45] Date of Patent: Jan. 2, 1996

[54] AUTOMATIC POLARITY SWITCHING OUTPUT CIRCUIT

[75] Inventors: Helmut Vietze; Bruno Weisshaupt, both of Frauenfeld, Switzerland; Robin J. Miller, Havant, United Kingdom; Albrecht Schoy, San Jose, Calif.

[73] Assignee: Baumer Electric AG, Frauenfeld, Switzerland

[21] Appl. No.: 181,749

[22] Filed: Jan. 21, 1994

Related U.S. Application Data

[63] Continuation-in-part of Ser. No. 862,128, Apr. 2, 1992, abandoned, which is a continuation-in-part of Ser. No. 536,688, Jul. 10, 1990, abandoned.

[30] Foreign Application Priority Data

Nov. 18, 1988 [CH] Switzerland ............... 4289/88

[51] Int. Cl.$^6$ ................................. G01R 19/14
[52] U.S. Cl. ............... 327/29; 327/30; 340/660; 361/86
[58] Field of Search ............... 327/28, 29, 30, 327/50, 72, 78, 51, 73, 403; 340/660; 361/86

[56] References Cited

U.S. PATENT DOCUMENTS

| | | | |
|---|---|---|---|
| 2,909,674 | 10/1959 | Moore et al. | 307/291 |
| 3,697,782 | 10/1972 | Matouka | 327/28 |
| 3,916,326 | 10/1975 | Woyton | 327/30 |
| 4,298,838 | 11/1981 | Akamatsu et al. | 327/28 |
| 4,670,667 | 6/1987 | Petit | 307/254 |
| 4,689,499 | 8/1987 | Yee | 327/28 |
| 4,982,107 | 1/1991 | Fayfield | 327/28 |

*Primary Examiner*—Timothy P. Callahan
*Assistant Examiner*—My-Trang Nu Ton
*Attorney, Agent, or Firm*—Walter C. Farley

[57] ABSTRACT

A measurement circuit in the output circuit of a sensor detects the polarity of a source to which a load is connected. The detection of one of the two polarities establishes one of two states which is stored in a storing element and the correct one of two drivers is switched to the output terminals. This state is maintained for as long as there is no change to the polarity at the output terminals. If the terminals are interchanged, then the measurement circuit correctly restores the stored state, so that the correct driver is associated with the load in each case. If positive instead of negative switching sensors are required, there is no need to replace the equipment. When the voltage is turned on, the equipment is initialized, so that it is set in accordance with the new circumstances.

11 Claims, 2 Drawing Sheets

FIG. 5
| | FF ⎍ | OUT ⎍ |
|---|---|---|
| T1 | 1 | 0 |
| T2 | 0 | 1 |
FIG. 2
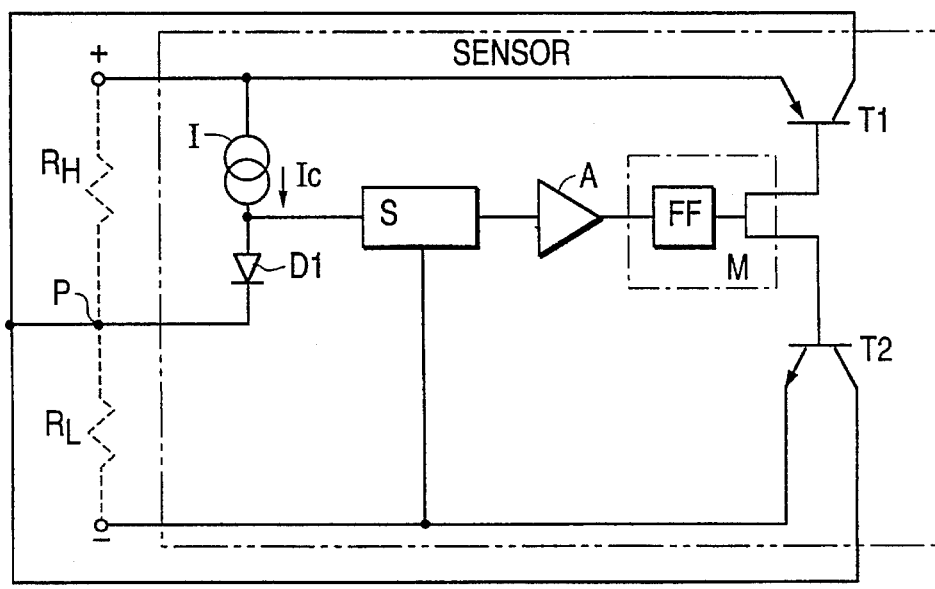
FIG. 3
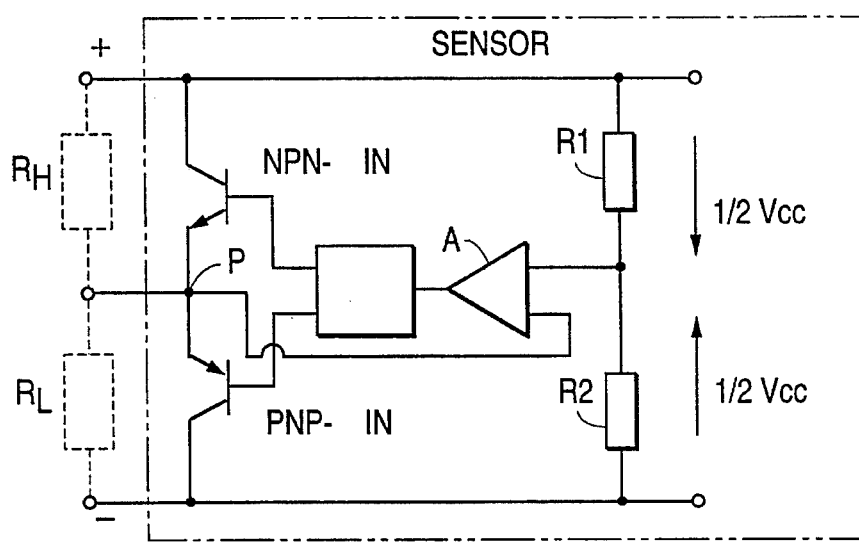

AUTOMATIC POLARITY SWITCHING OUTPUT CIRCUIT

CROSS REFERENCE TO RELATED APPLICATION

This is a continuation-in-part of Ser. No. 07/862,128 filed Apr. 2, 1992, now abandoned, which was a continuation-in-part of Ser. No. 07/536,688 filed Jul. 10, 1990, and now abandoned.

FIELD OF THE INVENTION

This invention relates to a method for the automatic identification or recognition of the polarity of the electrical connection of a load and the automatic association of the appropriate current source or drain with the load, as well as to an output circuit in the nature of an interface between two circuits for carrying out the method.

BACKGROUND OF THE INVENTION

Power-switching output circuits are generally designed with transistors. In the context of the present invention, output circuits are involved which, in actual fact, switch, i.e., carry a switching current. As a function of the use of the transistors, they can be the npn or pnp type, which have opposite current directions, i.e., switch to a positive or a negative potential. The circuits carrying the switching current are designed accordingly and therefore this also applies to the circuits switched with the switching current.

In order to have greater freedom with increased circuit complexity, use is made of output circuits which an carrying a switching current to both the negative and positive potential, an example being a push-pull circuit. Using this circuit as a basis, there are user-related modifications with corresponding advantages and disadvantages.

Reference is made to position sensors as a typical user problem. These can be position sensors which operate inductively, ultrasonically, optically or capacitively to sense the position for a movable article. It is clear that a multiplicity of circuits are possible, all of which have an output circuit for "switching" any user. Such position circuits either have an output switching to positive potential, or an output switching to negative potential, with optionally the possibility for both, although it is not possible with prior art circuits to simultaneously use the latter possibility, e.g., the push-pull output circuit. The switching function can be such that through the physical sensor function closing of the switch is brought about (normally open contact, NOC) or withdrawn (normally closed contact, NCC). On connection, the use must either adopt a positive normally open contact and therefore a negative normally closed contact, or a negative normally open contact and therefore a positive normally closed contact. Further developed variants in the direction of a universal output circuit must always be rewired in order to obtain the desired switching polarity.

SUMMARY OF THE INVENTION

An object of the present invention is therefore to provide a method for the automatic identification of the polarity of the electrical connection of a load and the automatic association of the corresponding current source or, conversely, the corresponding drain, with the load, together with an output circuit in the sense of an interface between two circuits for carrying out the method and in particular an output circuit for switching networks, which do not have these disadvantages and instead automatically set the desired switching polarity without any wiring change or line interchange. In addition, this output circuit should have minimum circuit complexity, so that a broad range of uses is not hindered by constructional and economical considerations.

BRIEF DESCRIPTION OF THE DRAWINGS

The invention is described in greater detail hereinafter with reference to preferred embodiments shown in the attached drawings, wherein:

FIG. 2 is a schematic diagram of a basic circuit of an embodiment of the invention with current sensing;

FIG. 3 is a schematic diagram of a basic circuit of an embodiment of the invention with voltage sensing;

FIG. 5 is a truth table illustrating the states of a bistable device in the embodiment of FIG. 2.

DESCRIPTION OF THE PREFERRED EMBODIMENTS

An essential part of the inventive output circuit is a relatively uncomplicated measurement circuit. The invention is based on the idea of generating an indicator current in the output circuit. This indicator current can be made to flow across a blocking element in much the same way as through a valve, through the external wiring, i.e., the user wiring, or in the case of reversed polarity of the valve it flows minimally or does not flow at all. The measurement circuit can consequently detect whether the load at the terminals (the user circuit) is connected to a negative or positive potential.

In place of the sensing of an indicator current, it is possible to connect a balanced voltage to the user circuit. As a function of the polarity, the user circuit voltage unbalances the symmetry toward one or other polarity and causes the circuit to carry out a counter-reaction eliminating the asymmetry again, which indicates whether the load is connected to a negative or a positive potential. Thus, in the case of either current or voltage sensing, the output circuit connects to the load an npn or pnp driver stage, both already being provided in the output circuit. Thus, there is no need for polarity reversal, rewiring or the like, which naturally helps to prevent incorrect connections during assembly. Thus, e.g., a proximity switch with the output circuit according to the invention has connections, which appear to be two "neutral" connections, which are connected to the load and everything else is carried out by the output circuit. The other important effect is the greatly reduced inventory since it is no longer necessary to store different output stage types (pnp or npn, normally open or closed contacts).

Figure 1A:
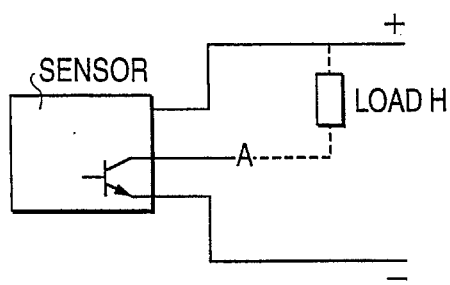
FIGS. 1A, 1B and 1C are schematic circuit diagrams of three forms of circuit outputs according to the prior art, 1A to a positive potential, 1B to a negative potential and 1C in the form of a push-pull circuit against one or other potential.
Figure 1B:
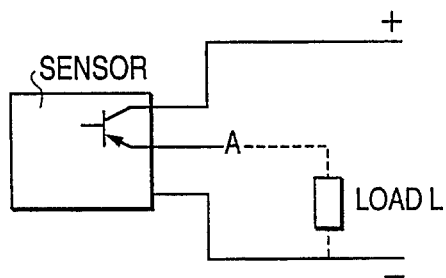
Figure 1C:
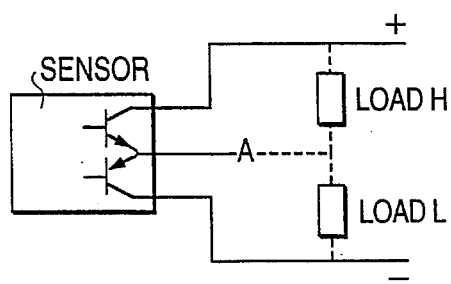

It is clear that the transistor outputs according to the prior art shown in FIGS. 1A, 1B and 1C do not have these advantages, because they operate in either the pnp or npn mode and, in response to the corresponding signal at the base, connect through in the only possible current direction. In the case of the push-pull circuit shown at FIG. 1C the situation is the same, because it either operates in the npn or in the pnp mode, as a function of the terminals between which the load is switched.

FIGS. 2 and 3 show the completely automatic switching of the output stage to one or other driver type.

The basic principle of the output circuit of the invention is as follows.

The basic principle is that a measurement circuit in the output circuit of the sensor measures, at the user circuit or load connected to its terminals, the voltage polarity to which it is connected. The detection of one or other of the two states establishes the state of a storing element M and switches the correct driver to the output terminals. This state is maintained for as long as there is no change to the polarity of the output terminals. However, if there is an interchange of terminals, e.g., due to the replacement of a defective device, and consequently there is no specification as to how the connection is to take place, then the measurement circuit correctly restores the stored state, so that the correct driver is associated with the user circuit.

Fundamentally the measurement circuit can comprise either of two indicators, either for current sensing or voltage sensing, an embodiment for each of the two possibilities being shown hereinafter.

Current Sensing of Output Terminals (FIG. 2)

A current $I_c$ is provided from a current source I to a diode D1. If a load is connected between a common point P at the cathode of the diode and a lower potential, as is the case with $R_L$, this establishes a complete circuit so that current $I_c$ can flow through the diode and load $R_L$. This current flow is detected and amplified by means of a current reflector S the input of which is connected to the anode of diode D1 and the output of which is connected to the input of a transimpedance amplifier A, which supplies at its output a voltage proportional to the detected current. This voltage is evaluated and stored in a following circuit M for activating one or other driver T1 or T2. As an example, circuit M can include a flip-flop circuit to act as a memory of the state last detected by the current sensor. An output of the flip-flop is connected to the bases of pnp and npn transistors T1 and T2 the emitters of which are connected to the positive and negative lines, respectively, and the collectors of which are connected to a common point P at the cathode of the diode between the possible load locations.

However, if the load is connected to a higher potential, i.e., if load $R_H$ is connected in the circuit rather than $R_L$, then little or no current can flow through the diode. This is naturally noticed by the current reflector S which indicates to the series-connected amplifier A "no current", producing at the amplifier output a corresponding voltage signal.

Thus, at the output of amplifier A it is possible to read off the two states indicating to which potential, i.e., high or low, the attached load is connected. The detected one of the two measured states can then be used for the particular switching state to be retained by a storing circuit and on the basis thereof the appropriate driver stage is switched on.

Figure 4:
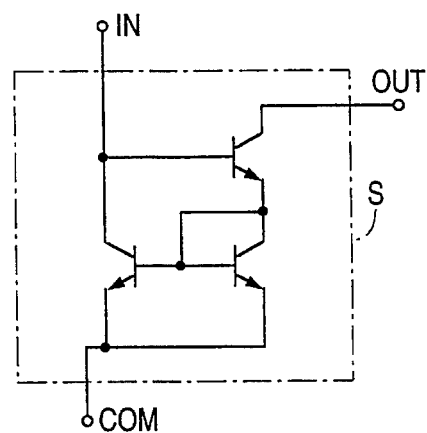
FIG. 4 is a schematic diagram of a circuit usable as a sensor in the embodiment of FIG. 2.

The current reflector S, shown as a block in FIG. 2, can be replaced by any of several circuits such as those known as Wilson current mirror circuits, one of which is shown in FIG. 4. This specific example is a Series TL011 circuit made by Texas Instruments Incorporated.

Voltage Sensing of the Output Terminals (FIG. 3.)

The embodiment shown in FIG. 3 uses "voltage information" in place of "current information" and in that circuit a voltage caused in the load by the indicator current is sensed. The supply voltage $V_{cc}$ is symmetrically divided by a voltage divider including impedances R1 and R2 and the two half-$V_{cc}$ voltages are compared with a reference potential. When an external load $R_H$ or $R_L$ is connected between the common point P and the positive or negative lead, there is an asymmetry toward one or other polarity, which leads to compensation of the circuit, i.e., the driving of one of the two transistors T1 or T2 of a push-pull circuit. This current signal is used for setting the storage element, e.g., a flip-flop, as described in connection with FIG. 2.

Operation of a Proximity Sensor with the Output Circuit

Automatic load detection preferably takes place in a starting phase during the time of a starting pulse suppression of the proximity sensor. Starting pulse suppression lasts 20 to 40 ms. This time is long enough for measuring and positioning the storage element. By the time the suppression has ended, then the interface and therefore the sensor connected thereto has the correct polarity relative to the user circuit, i.e., the load. Thus, during starting, the time interval is used up entirely at the start, so as to be able to determine the load with the aid of the indicator current. The result, i.e., the state, is stored in a storage circuit such as a flip-flop and the current direction released by the load. This is either in the direction of a positive source through an npn driver transistor, or in the direction of a drain through the pnp driver transistor, as a function of the flip-flop output setting. This ensures that the two drivers are not simultaneously switched on.

The measurement circuit in the output circuit of the sensor measures, with the user circuit applied to its terminals, to which voltage polarity it is connected. The detection of one of the two states is used for fixing that state in a storing element and for connecting the correct driver to the output terminals. This state is maintained for as long as there is no change in the polarity of the output terminals. If e.g., through the replacement of a defective relay the terminals are interchanged, then the measurement circuit directly restores in correct manner the stored state, so that the correct driver is always associated with the user circuit. However, if e.g., through the replacement of a control card or system, positive instead of negative switching sensors are now required, unlike hitherto, there is no need to replace the equipment. The equipment is instead initialized by the invention when the voltage is switched on, setting the state corresponding to the new circumstances.

What is claimed is:

1. A method for the automatic identification of the polarity of an electrical connection of an output circuit to a load and the automatic connection of a selected source to the load comprising the steps of connecting an output circuit to the load so that the load is only between a common terminal of the output circuit and a selected one of two differently poled terminals of the output circuit during operation times of said output circuit, the output circuit having a two-state storage device and two current sources one of which is properly connectable to the load by the storage device for each of two possible polarities of the load, measuring the polarity of a voltage in the output circuit in response to current flow between the output circuit and the load, setting the state of the storage device to correspond with the measured polarity of the voltage, and selectively connecting one of the current sources to the load in response to the set state of the storage device.

2. A method according to claim 1 wherein one of the two current sources is a pnp transistor current source and the other is an npn transistor current source.

3. A method according to claim 2 wherein the storage device includes a flip-flop circuit each state of which controls the conduction of one of said current sources.

4. A method according to claim 1 wherein the storage device includes a flip-flop circuit each state of which controls the conduction of one of said current sources.

5. A method according to claim 4 and further comprising maintaining the state of the flip-flop until the polarity of the load changes.

6. An output circuit for supplying current to a load having a polarity in accordance with the polarity of the load, the output circuit having a common terminal and two differently poled terminals for connection of the load between the common terminal and one of the differently poled terminals, the output circuit comprising the combination of first and second current sources of opposite polarities;

means connected to the load for sensing the polarity of the load;

storage means having two states, said storage means being connected to said sources so that only one of said sources is operatively connected to said load in each of the states during operation times of said output circuit; and means responsive to said means for sensing for setting the storage means to one of said states in accordance with the polarity of said load.

7. An output circuit in accordance with claim 6 wherein said storage means includes a flip-flop circuit.

8. An output circuit in accordance with claim 7 wherein said means for sensing the polarity of the load is a voltage balancing circuit referenced to a reference potential, the output of said balancing circuit being connected to an input of said storage means.

9. An output circuit according to claim 8 wherein said current sources are npn and pnp circuits respectively, one of said current sources being associated with each of said states of said storage means.

10. An output circuit in accordance with claim 6 wherein said means for sensing the polarity of the load is a voltage balancing circuit connected and referenced to a reference potential, the output of said balancing circuit being connected to an input of said storage means.

11. An output circuit according to claim 6 wherein said current sources are npn and pnp transistor circuits respectively, one of said current sources being associated with each of said states of said storage means.

* * * * *